(12) United States Patent
Woo

(10) Patent No.: US 11,016,242 B2
(45) Date of Patent: May 25, 2021

(54) DISPLAY DEVICE

(71) Applicant: LG DISPLAY CO., LTD., Seoul (KR)

(72) Inventor: Yongtaek Woo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/879,412

(22) Filed: May 20, 2020

(65) Prior Publication Data

US 2020/0371284 A1 Nov. 26, 2020

(30) Foreign Application Priority Data

May 21, 2019 (KR) .......................... 10-2019-0059425

(51) Int. Cl.
F21V 21/00 (2006.01)
F21V 8/00 (2006.01)
H05K 5/02 (2006.01)

(52) U.S. Cl.
CPC .......... *G02B 6/0088* (2013.01); *G02B 6/0055* (2013.01); *G02B 6/0095* (2013.01); *H05K 5/0204* (2013.01); *H05K 5/0234* (2013.01)

(58) Field of Classification Search
CPC ....... G02B 6/0095; G02F 2001/133317; G02F 1/133308
USPC ................................ 362/631, 632, 633, 634
See application file for complete search history.

(56) References Cited

U.S. PATENT DOCUMENTS

2007/0247870 A1* 10/2007 Sakai .................... G02B 6/0068 362/612
2008/0151579 A1* 6/2008 Kim .................. G02F 1/133608 362/633
2011/0310543 A1* 12/2011 Kim .................. G02F 1/133308 361/679.01
2012/0162880 A1* 6/2012 Yoon ..................... G02F 1/1339 361/679.01
2012/0281383 A1* 11/2012 Hwang ................. G02B 30/25 361/807
2013/0293804 A1* 11/2013 Kim ...................... B29C 65/542 349/58
2016/0041420 A1* 2/2016 Takase .............. G02F 1/133308 361/724
2016/0156118 A1* 6/2016 Joo ...................... H01R 12/716 361/752
2017/0003443 A1* 1/2017 Yoshikawa ........ G02F 1/133308

FOREIGN PATENT DOCUMENTS

KR 10-2008-0043167 A 5/2008
KR 10-2016-0120429 A 10/2016
KR 10-2017-0035125 A 3/2017

* cited by examiner

*Primary Examiner* — Laura K Tso
(74) *Attorney, Agent, or Firm* — Birch, Stewart, Kolasch & Birch, LLP

(57) ABSTRACT

A display device according to the present disclosure can include a display panel, a backlight assembly providing light toward the display panel, a set cover including a rear cover part and a side cover part, wherein the rear cover part covers a rear surface of the backlight assembly and the side cover part extending from the rear cover part covers a side surface of the backlight assembly, and a guide panel coupled to the set cover and supporting edges of the display panel. The set cover can be composed of plastic, and the rear cover part and the side cover part can have an integrally formed shape and can be exposed to outside.

11 Claims, 8 Drawing Sheets

DISPLAY DEVICE

CROSS-REFERENCE TO RELATED APPLICATIONS

This application claims the benefit and priority of Korean Patent Application No. 10-2019-0059425 filed in the Republic of Korea on May 21, 2019, the entire contents of which are expressly incorporated herein by reference for all purposes as if fully set forth into the present application.

BACKGROUND

Field of the Disclosure

The present disclosure relates to a display device. More particularly, the present disclosure relates to a display device having a simplified structure.

Description of the Background

A display device is a device for displaying images. The display device can be mounted on or installed in an electronic device, such as a laptop, a monitor, a television, and a mobile phone, and displays images. In the case where the display device is a liquid crystal display, the display device includes a display panel, a backlight assembly for outputting light toward the display panel, and covers covering the display panel and the backlight assemblies.

In addition, the backlight assembly can include a light source unit for generating light, a light guide plate for guiding the light provided from the light source unit toward the display panel, optical sheets arranged on a front surface of the light guide plate and adjusting a progress direction of the light, and a reflective plate or reflective sheet placed on a rear surface of the light guide plate and reflecting the light.

In the meantime, due to the configuration of the backlight assembly described above, the weight and the volume of the display device can be increased. Therefore, in order to make the display device thin, schemes for modifying the structure of the backlight assembly as well as the structure of elements covering the backlight assembly and the display panel of the display device have been studied.

The foregoing is intended merely to aid in the understanding of the background of the present disclosure, and is not intended to mean that the present disclosure falls within the purview of the related art that is already known to those skilled in the art.

SUMMARY

The present disclosure is intended to provide a display device having a simplified structure, so that component costs are reduced and an assembly process is simplified.

According to an embodiment for achieving the above-described objective, there is provided a display device including a display panel; a backlight assembly providing light toward the display panel; a set cover including a rear cover part and a side cover part, wherein the rear cover part covers a rear surface of the backlight assembly and the side cover part extending from the rear cover part covers a side surface of the backlight assembly; and a guide panel coupled to the set cover and supporting edges of the display panel. The set cover is composed of plastic, and the rear cover part and the side cover part have an integrally formed shape and are exposed to outside.

In an embodiment, multiple wall-mount coupling holes can be defined on a rear surface of the rear cover part which is exposed to outside.

In an embodiment, at least a portion of a surface of the set cover which is exposed to outside can have a round shape.

In an embodiment, the display device can further include a base installed on a supporting surface; and a stand. The stand can be coupled to the base and a portion of the set cover which is exposed to outside, and can position the display panel at a height from the base.

In an embodiment, the backlight assembly can include a light source unit generating light; a light guide plate guiding the light provided from the light source unit toward the display panel; and a reflective member positioned between the light guide plate and the rear cover part and reflecting light.

In an embodiment, the set cover can further include one or more ribs each having a shape protruding toward the light guide plate from an inner surface of the side cover part. In addition, viewing the light guide plate on a plane, the ribs can be multiple in number, and the multiple ribs can be arranged along edges of the light guide plate, being spaced apart from each other.

In an embodiment, the ribs can have a shape integrally formed with the side cover part and the rear cover part, and the ribs can be composed of a plastic material.

In an embodiment, the set cover can further include: an auxiliary receiving space provided with the rear cover part and having a shape opened toward a rear of the rear cover part; and a lid part covering the auxiliary receiving space.

In an embodiment, the display device can further include a light source housing formed of a metal material and coupled to the light source unit. The light source housing can include: a light source cover part partially surrounding the light source unit; and a contact part extending from the light source cover part toward the auxiliary receiving space.

In an embodiment, the display device can further include a circuit film electrically connected to the display panel; and a circuit board electrically connected to the circuit film and generating a control signal for driving the display panel. The circuit board can be received inside the auxiliary receiving space and can be in contact with the contact part of the light source housing.

In an embodiment, viewing the circuit board and the contact part in a cross section, the circuit board and the contact part can be horizontally arranged and can be in contact with each other inside the auxiliary receiving space.

In an embodiment, a top of the side cover part can be provided with a coupling groove receiving the guide panel, and the guide panel received in the coupling groove and the side cover part can be coupled in a hooking manner.

In an embodiment, the display device can further include a front cover coupled to the set cover and covering an edge of the display panel. The front cover can be composed of plastic and the front cover can be exposed to outside.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
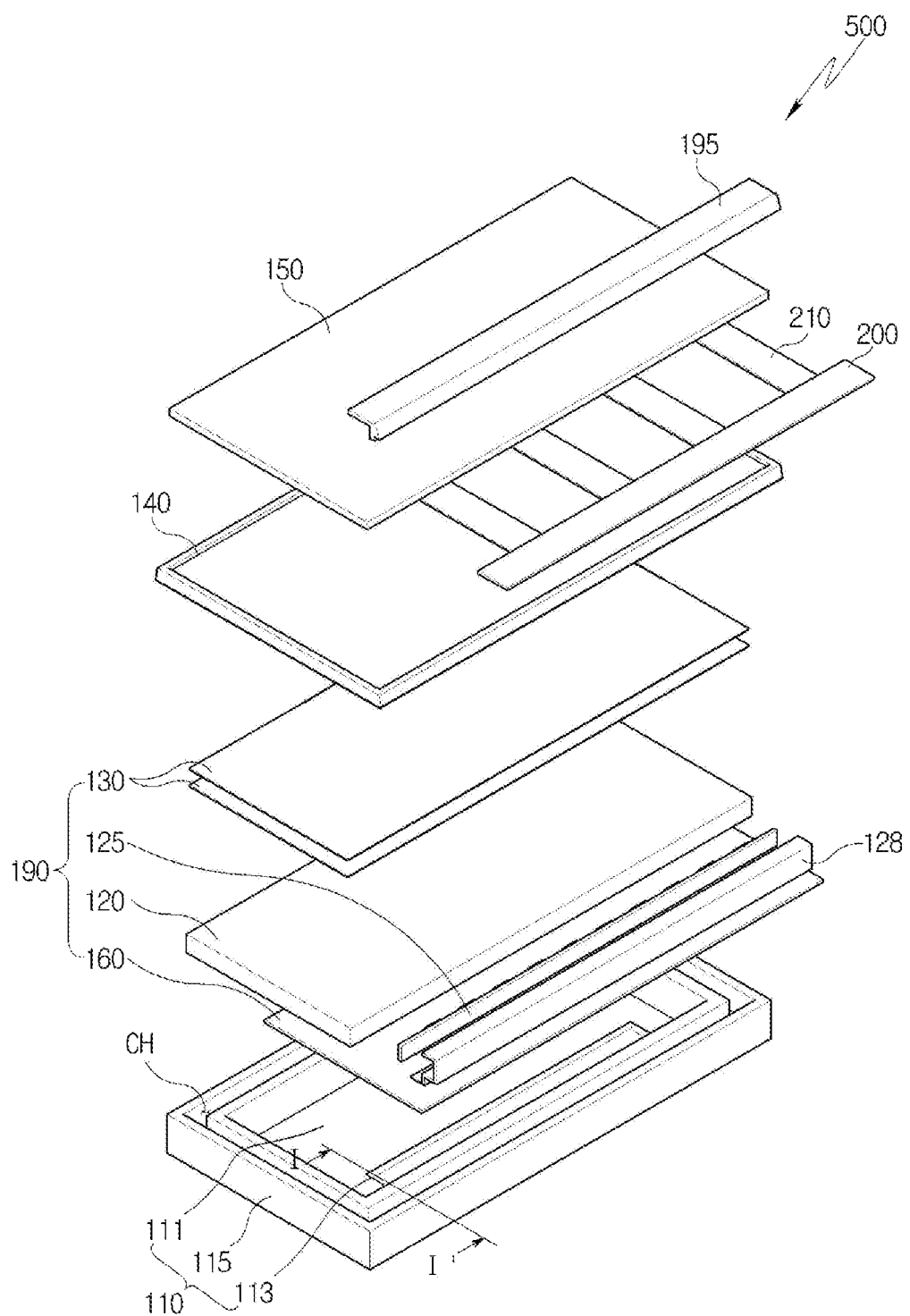
FIG. 1 is an exploded perspective view of a display device according to an embodiment of the present disclosure.

Hereinafter, various embodiments of the present disclosure will be described in detail with reference to the accompanying drawings. The above-described objectives, features, and effects of the present disclosure can be understood through the embodiments related to the drawings. However, the present disclosure is not limited to the embodiments described herein, and can be applied and modified in various forms. It should not be interpreted that the scope of the present disclosure is limited to the embodiments described below. In the meantime, the same reference numerals in the embodiments and the drawings denote the same element.

In addition, in the specification, the terms "first", "second", etc. are not used to limit element or to define any orders, but to distinguish one element from another. In addition, when a part, such as a film, a region, an element, etc. is said to be positioned "on" or "above" another part, it can be directly on the part or be indirectly on the part with an intervening film, region, element, etc. interposed therebetween.

Figure 2:
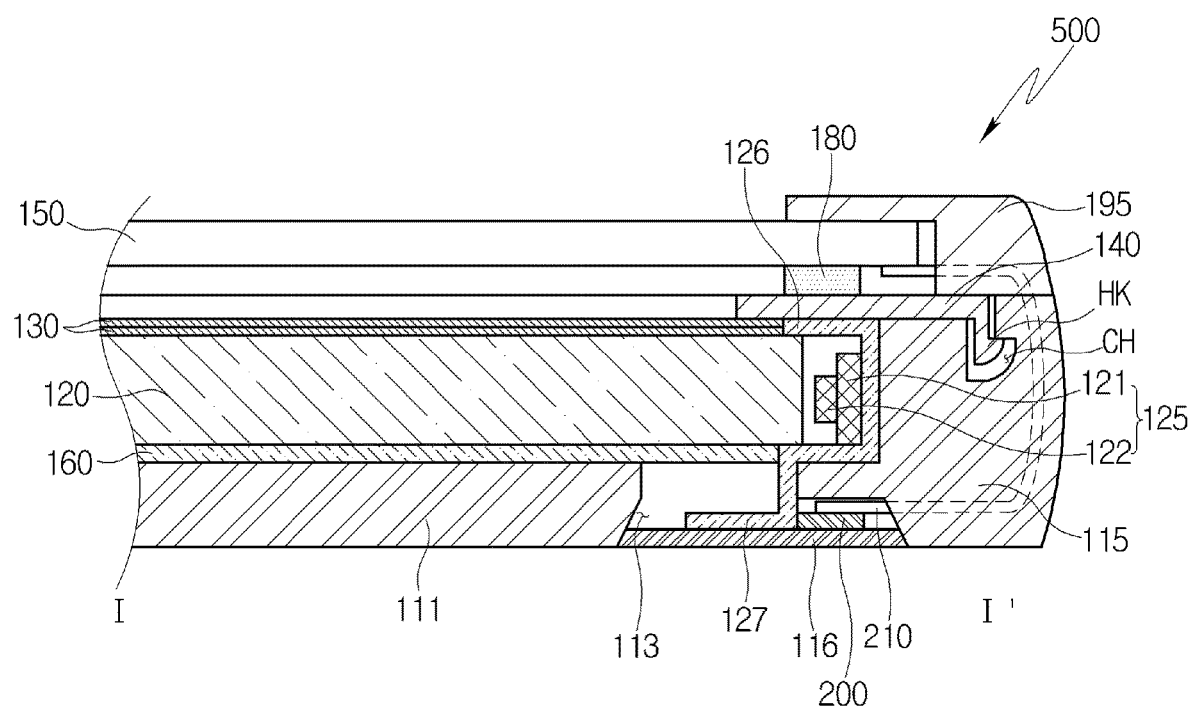
FIG. 2 is a cross-sectional view taken along line I-I' shown in FIG. 1.
Figure 3:
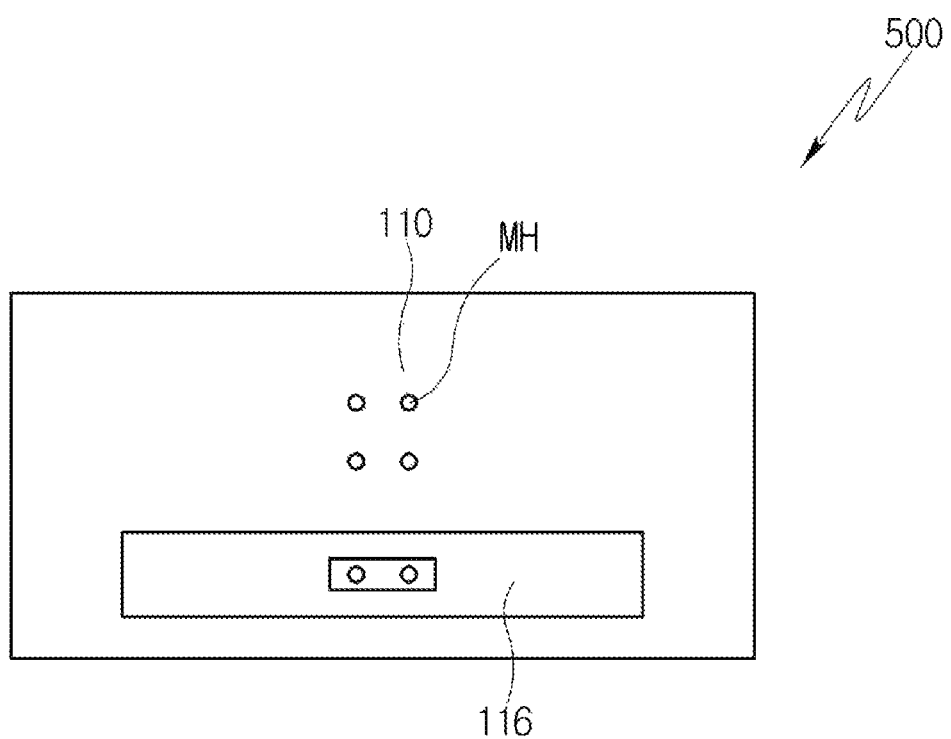
FIG. 3 is a plan view showing a rear surface of the display device shown in FIG. 1.
Figure 4:
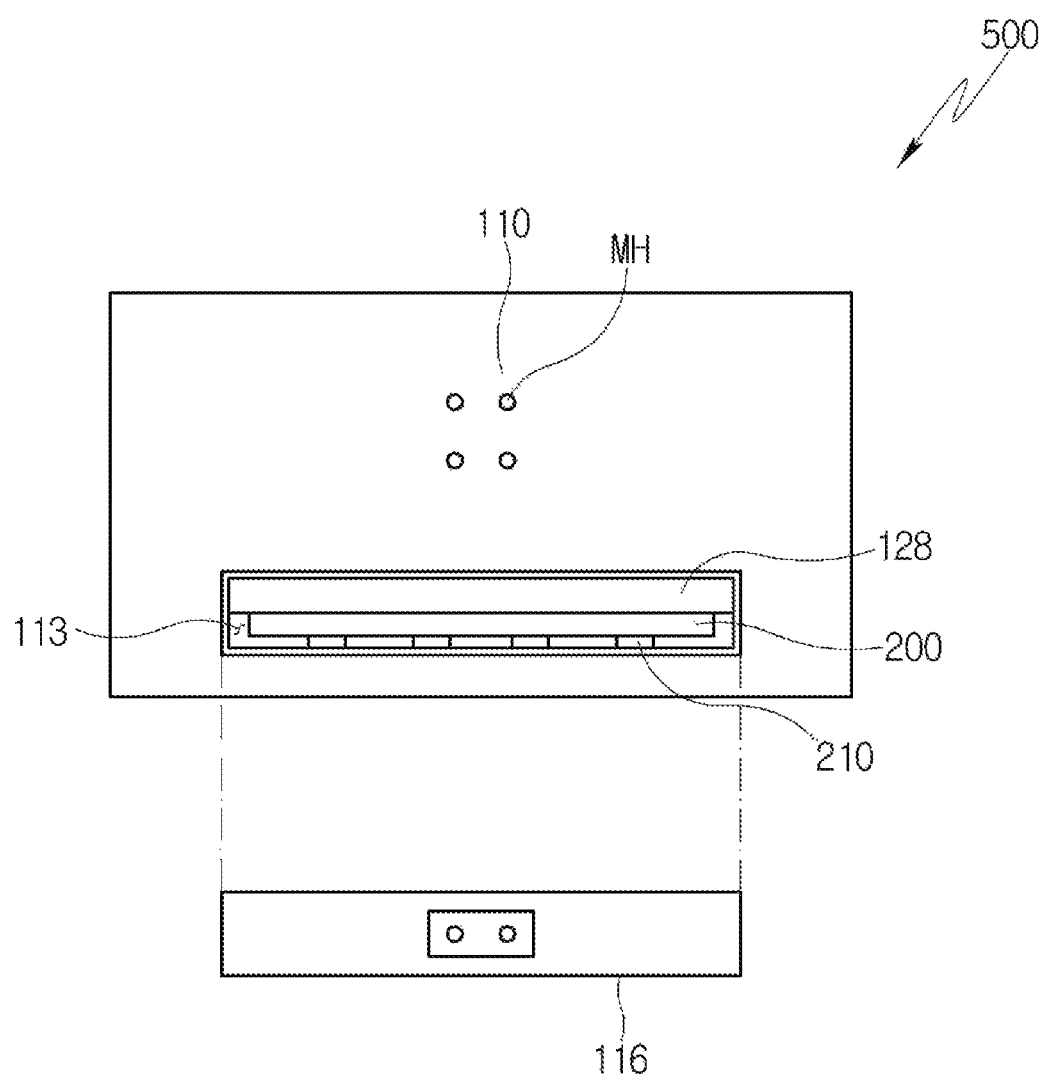
FIG. 4 is a plan view showing a state in which a lid part is separated from a set cover of the display device shown in FIG. 3.

FIG. 1 is an exploded perspective view of a display device according to an embodiment of the present disclosure. FIG. 2 is a cross-sectional view taken along line I-I' shown in FIG. 1. FIG. 3 is a plan view showing a rear surface of the display device shown in FIG. 1. FIG. 4 is a plan view showing a state in which a lid part is separated from a set cover of the display device shown in FIG. 3. All the components of the display device according to all embodiments of the present disclosure are operatively coupled and configured.

Referring to FIGS. 1, 2, 3, and 4, a display device 500 is a device for displaying an image. In this embodiment, the display device 500 can be mounted or installed on a device, such as a television, and a monitor, and can display images.

In this embodiment, the display device 500 includes a display panel 150, multiple circuit films 210, a circuit board 200, a set cover 110, a guide panel 140, a front cover 195, a backlight assembly 190, and a light source housing 128.

The display panel 150 displays an image. In this embodiment, the display panel 150 can be a liquid crystal display panel, but can be of other type. The display panel 150 displays an image by using light provided from the backlight assembly 190.

The multiple circuit films 210 electrically connect the display panel 150 to the circuit board 200. In this embodiment, the multiple circuit films 210 can be flexible printed circuit boards. Each of the multiple circuit films 210 includes a flexible base film, and printed circuit patterns arranged on the base film. In addition, each of the multiple circuit films 210 can be equipped with a driver chip mounted thereon in a chip-on-film manner, and the driver chip can output data signals toward the display panel 150.

In this embodiment, the circuit board 200 can be a main board that generates a control signal for driving the display panel 150. The circuit board 200 can be electrically connected to the display panel 150 through the multiple circuit films 210. In this embodiment, the multiple circuit films 210 are bent so that the circuit board 200 is positioned to overlap a rear surface of the display panel 150 within the set cover 110.

The set cover 110 includes a rear cover part 111, and a side cover part 115 extending from the rear cover part 111. The rear cover part 111 covers a rear surface of the backlight assembly 190, and the side cover part 115 covers a side surface of the backlight assembly 190. In addition, the set cover 110 is directly or indirectly combined with the display panel 150, the circuit board 200, the guide panel 140, the backlight assembly 190, and the light source housing 128 so as to make the elements of the display device 500 into a set.

In this embodiment, the set cover 110 can be composed of plastic. In terms of a manufacturing method, the set cover 110 can be manufactured using a plastic molding method, such as compression molding, and injection molding. Accordingly, the rear cover part 111 and the side cover part 115 of the set cover 110 can have an integrally formed shape.

In this embodiment, the set cover 110 of the display device 500 can be an element exposed to outside. For example, viewed from the rear of the display device 500, the rear cover part 111 of the set cover 110 is exposed to outside, and viewed from the side of the display device 500, the side cover part 115 of the set cover 110 is exposed to outside. Accordingly, viewed from the rear and the side of the display device 500, the exterior of the display device 500 is implemented using a single component of the set cover 110. Therefore, viewed from both the rear and the side of the display device 500, gaps between multiple components do not occur, so that completeness of the display device 500 and excellence in the external appearance thereof are enhanced.

According to the above-described configuration of the set cover 110, the set cover 110 can cover the elements of the display device 500 and simultaneously, can make the elements of the display device 500 into a set. Accordingly, in this embodiment, an element covering the elements of the display device 500 and an element making the elements of the display device 500 into a set can be integrated as the set cover 110, so that the number of components constituting the display device 500 can be reduced. Consequently, the volume of the display device 500 can be reduced, and the structure of the display device 500 is simple so that the assembly process of the display device 500 is simple and the time required to assemble the display device 500 is reduced.

In addition, according to the above-described configuration of the set cover 110, the set cover 110 is positioned on the outermost side of the display device 500 and is thus exposed to outside. Therefore, in order to make the exterior of the display device 500 beautiful, a special design can be applied to a portion of the set cover 110, which is exposed to outside, or an additional structure, such as a wall-mount coupling hole and a stand device, can be easily applied to the portion of the set cover 110, which is exposed to outside. This will be described in detail with reference to FIGS. 5 and 6.

In this embodiment, the guide panel 140 can have a shape of a frame corresponding to the edges of the display panel

150. The guide panel 140 is coupled to the set cover 110 and supports the edges of the display panel 150.

In this embodiment, the top of the side cover part 115 is provided with a coupling groove CH of a predetermined depth, and a portion of the guide panel 140 is received inside the coupling groove CH, so that the guide panel 140 is primarily coupled to the set cover 110. Further, the portion of the guide panel 140, which is received inside the coupling groove CH, is provided with a hook part HK, and the hook part HK of the guide panel 140 is coupled to the coupling groove CH of the side cover part 115 in a hooking manner, so that the guide panel 140 is secondarily coupled to the side cover part 115.

An adhesive pad 180 is provided on the guide panel 140, and the edges of the display panel 150 are adhered on the adhesive pad 180. Accordingly, by adhesion of the adhesive pad 180, the edges of the display panel are fixed on the guide panel 140, and within the display device 500, the guide panel 140 can support the edges of the display panel 150.

The front cover 195 is positioned on the front surface of the display device 500, and covers the display panel 150. In this embodiment, the front cover 195 can be placed to be adjacent to the edge corresponding to the position of the light source unit 125, among the edges of the display panel 150. However, the present disclosure is not limited to the structure of the front cover 195. In another embodiment, the front cover 195 can have a shape surrounding the four edges of the display panel 150.

In this embodiment, similarly to the above-described set cover 110, the front cover 195 can be composed of plastic. In addition, in the display device 500, the front cover 195 is an element exposed to outside, for example, the front cover 195 can be exposed to outside from the front of the at display device 500.

The backlight assembly 190 outputs light toward the display panel 150. The backlight assembly 190 is received inside the set cover 110. Therefore, the rear surface of the backlight assembly 190 is covered by the rear cover part 111 of the set cover 110, and the side surface of the backlight assembly 190 is covered by the side cover part 115 of the set cover 110.

In this embodiment, the backlight assembly 190 includes a light guide plate 120, a light source unit 125, an optical sheet unit 130, and a reflective member 160.

The light source unit 125 generates lighted used by the display panel 150 to display an image. In this embodiment, the light source unit 125 includes a light source substrate 121, and multiple light-emitting diode packages 122.

The light source substrate 121 has a shape extending along an edge of the light guide plate 120. The multiple light-emitting diode packages 122 are mounted on the light source substrate 121, and the multiple light-emitting diode packages 122 are arranged on the light source substrate 121, being spaced apart from each other in a length direction of the light source substrate 121. The multiple light-emitting diode packages 122 emit light by using power provided through the light source substrate 121, and the light emitted from the multiple light-emitting diode packages 122 enters toward the light guide plate 120.

The light guide plate 120 guides the light provided from the multiple light-emitting diode packages 122 toward the display panel 150. More specifically, the light incident on the light guide plate 120 is totally reflected inside the light guide plate 120, and the light totally reflected inside the light guide plate 120 is changed in its traveling direction by a light-outputting pattern formed on the rear surface of the light guide plate 120 and is then emitted out of the light guide plate 120. The light emitted out of the light guide plate 120 is provided to a display space of the display panel 150.

The optical sheet unit 130 controls the traveling direction of the light emitted out of the light guide plate 120. In this embodiment, the optical sheet unit 130 can include a diffusion sheet and a prism sheet. The diffusion sheet diffuses the light emitted out of the light guide plate 120. The prism sheet concentrates the light so that the traveling direction of the light emitted out of the light guide plate 120 or the diffusion sheet approaches the normal direction of the display panel 150.

The reflective member 160 is placed between the light guide plate 120 and the rear cover part 111 of the set cover 110. The reflective member 160 reflects the light emitted out of the rear surface of the light guide plate 120. Thus, the light reflected from the reflective member 160 enters back to the light guide plate 120. The reflective member 160 can have a shape of a plate or a shape of a sheet.

In this embodiment, the set cover 110 can further include an auxiliary receiving space 113 and a lid part 116.

The auxiliary receiving space 113 can be provided with the rear cover part 111. In this embodiment, the auxiliary receiving space 113 has a shape that is opened toward the rear of the rear cover part 111. For example, a predetermined volume of the rear cover part 111 is removed so that the auxiliary receiving space 113 is defined. Inside the auxiliary receiving space 113, the circuit board 200 and part of the light source housing 128 can be received therein.

The lid part 116 covers the auxiliary receiving space 113. In this embodiment, the lid part 116 can be composed of plastic. The lid part 116 is coupled to the rear cover part 111 so as to cover the auxiliary receiving space 113, so that the circuit board 200 received in the auxiliary receiving space 113 is covered by the lid part 116.

Further, the lid part 116 can be provided with multiple heat dissipation holes. Accordingly, heat generated from the circuit board 200 can be discharged to the outside of the display device 500 via the multiple heat dissipation holes formed through the lid part 116.

The light source housing 128 can be composed of a metal material, and the light source housing 128 is received inside the set cover 110 and is thus coupled to the light source unit 125. In this embodiment, the light source housing 128 includes a light source cover part 126 and a contact part 127.

The light source cover part 126 partially surrounds the light source unit 125. Viewing the light source cover part 126 in the cross section, the light source cover part 126 has a shape that is bent several times to partially surround the light source unit 125. The upper portion of the light source cover part 126 overlaps the light guide plate 120, so that light is prevented from leaking through the gap between the light guide plate 120 and the light source unit 125.

The contact part 127 can have a shape extending from the bottom of the light source cover part 126 toward the auxiliary receiving space 113. In addition, the contact part 127 extending toward the auxiliary receiving space 113 is in contact with the circuit board 200 received inside the auxiliary receiving space 113. As described above, the contact part 127 of the light source housing 128 is composed of a metal material, so that heat generated from the circuit board 200 is transferred toward the contact part 127 of the light source housing 128.

For example, in this embodiment, since the set cover 110 is composed of plastic, instead of the set cover 110, the light source housing 128 discharges heat generated during driving of the display device 500, to the outside. According to the above-described structure of the light source housing 128, heat generated from the light source unit 125 is transferred toward the light source cover part 126, and heat generated from the circuit board 200 is transferred toward the contact part 127. In addition, the heat transferred from the light source unit 125 and the circuit board 200 toward the light source housing 128 can be easily discharged to the outside of the display device 500 through the surface of the light source housing 128.

Further, in addition to the above-described heat dissipation function of the light source housing 128, since the contact part 127 of the light source housing 128 is in contact with the circuit board 200, static electricity of the circuit board 200 is discharged toward the contact part 127. Accordingly, the elements mounted on the circuit board 200 are prevented from being damaged due to the static electricity staying on the circuit board 200.

In this embodiment, as shown in FIG. 2, viewing the circuit board 200 and the contact part 127 in the cross section, the circuit board 200 and the contact part 127 are horizontally arranged and are thus in contact with each other inside the auxiliary receiving space 113. Therefore, even though the thickness of the rear cover part 111 is designed to be slim and thus the height defining the auxiliary receiving space 113 is low, the contact part 127 is easily in contact with the circuit board 200 in a direction horizontal to the circuit board 200, inside the auxiliary receiving space 113.

In this embodiment, multiple wall-mount coupling holes MH can be defined on the rear surface of the set cover 110, which is exposed to outside. More specifically, the multiple coupling holes MH are configured to install the set cover 110 on the wall surface. In this embodiment, each of the multiple coupling holes MH can be formed by partially removing the rear cover part 111 in the direction of the thickness from the outer surface of the rear cover part 111 of the set cover 110. The use of the multiple wall-mount coupling holes MH will be described with reference to the embodiment shown in FIG. 5 as follows.

Figure 5:
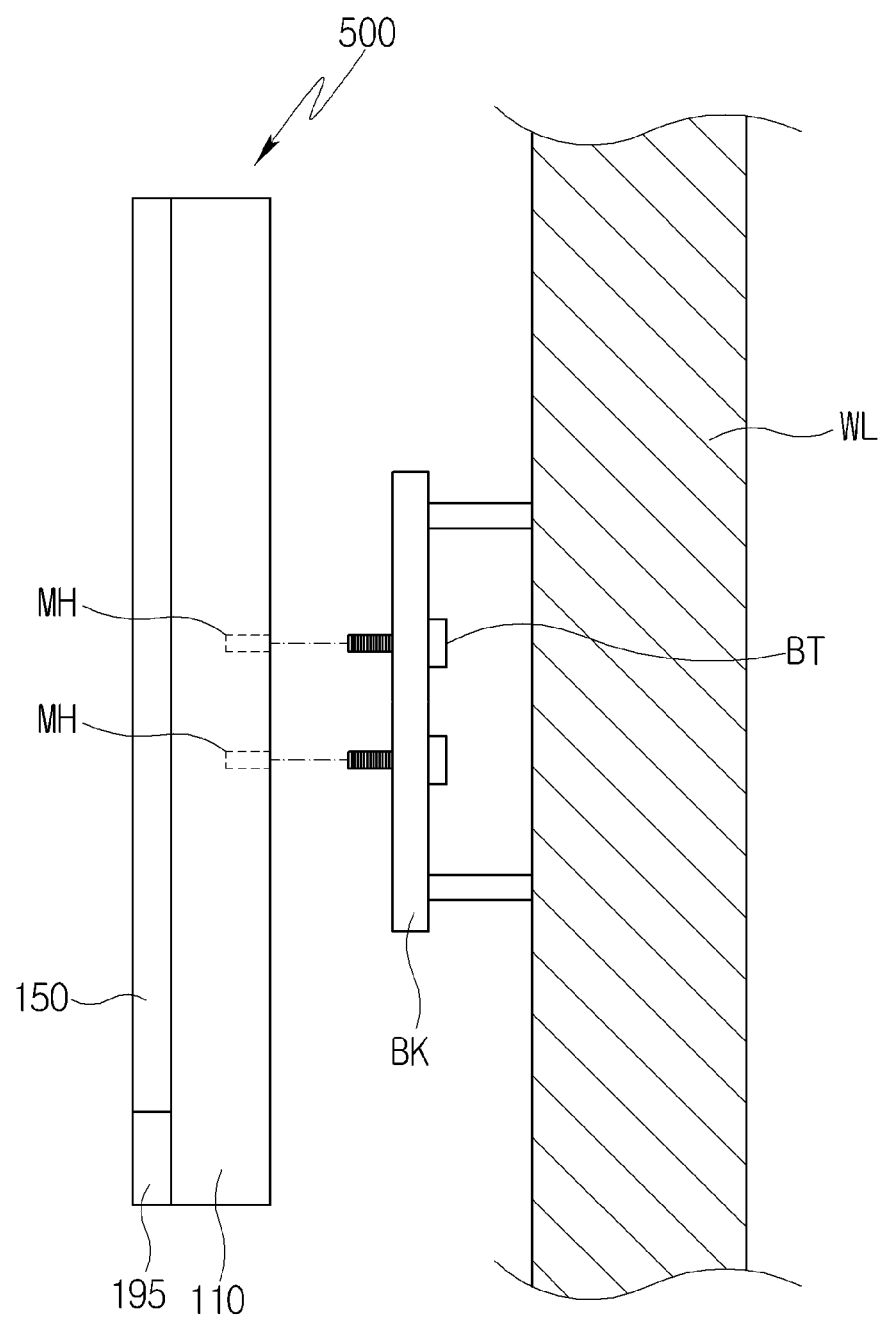
FIG. 5 is a side view showing that the display device shown in FIG. 1 is installed on a wall surface.

FIG. 5 is a side view showing that the display device 500 shown in FIGS. 1 and 3 is installed on a wall surface.

Referring to FIGS. 3 and 5, the display device 500 can installed on the wall surface WL. However, the wall surface WL is not limited thereto and can be any surface onto which the display device 500 can be mounted, attached, fixed, installed, or otherwise provided. As described above, the display panel 150 of the display device 500 is coupled to the set cover 110 and displays images. The set cover 110 covers the backlight assembly 190 (of FIG. 1) and is exposed to outside, viewed from the side surface and the rear surface of the display device 500.

In addition, the multiple wall-mount coupling holes MH are formed on the set cover 110. Each of the multiple coupling holes MH is formed in the direction of the thickness of the set cover 110 from the rear surface of the set cover 110, which is exposed to outside. The multiple coupling holes MH and a bracket BK installed on the wall surface WL are fastened with multiple bolts BT, so that the display device 500 is installed on the wall surface WL.

As described above, in this embodiment, by using the structural characteristic of the set cover 110, which is exposed to outside to cover the elements of the display device 500 and simultaneously makes the elements into a set, and the material characteristic of the set cover 110, which is formed of plastic and has excellent processability, the multiple wall-mount coupling holes MH can be directly formed on the set cover 110.

Figure 6:
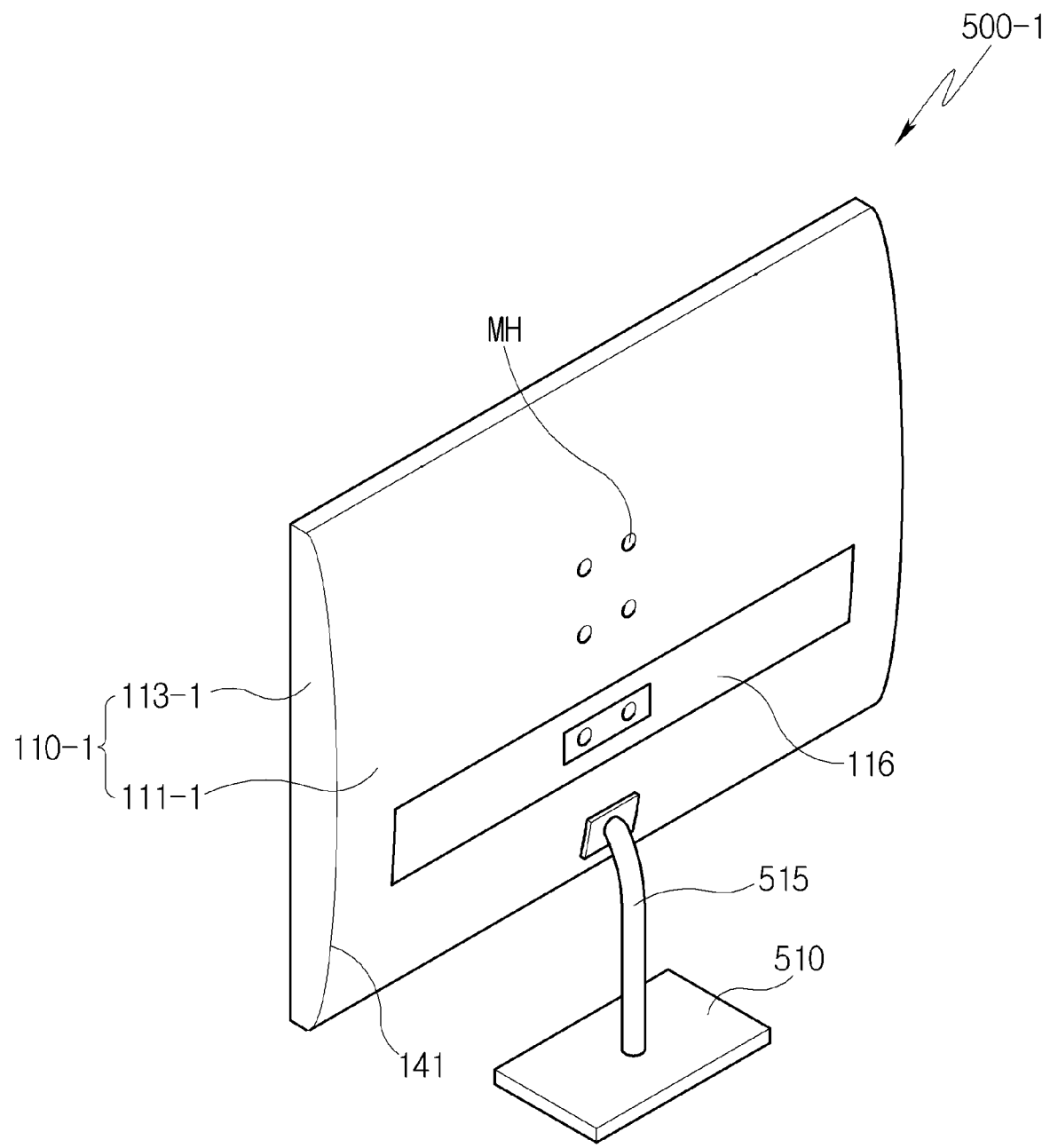
FIG. 6 is a perspective view showing a rear surface of a display device according to another embodiment of the present disclosure.

FIG. 6 is a perspective view showing a rear surface of a display device according to another embodiment of the present disclosure.

Referring to FIG. 6, in the display device 500-1, the rear surface and the side surface of the set cover 110-1 are exposed to outside, and the set cover 110-1 is composed of a plastic material having superior processability compared to a metal material, so that various designs can be applied to the set cover 110-1 to enhancing the design and for user convenience.

Comparing the configuration of the display device 500 shown in FIG. 1 and the configuration of the display device 500-1 shown in FIG. 6, the outer surface of the set cover 110-1 of the display device 500-1 shown in FIG. 6 has a round shape.

More specifically, in this embodiment, the set cover 110-1 of the display device 500-1 includes a rear cover part 111-1 and a side cover part 113-1. The rear surface of the rear cover part 111-1 which is exposed to outside can have around shape. Therefore, a corner 141 defined by the rear cover part 111-1 and the side cover part 113-1 can have a curved shape corresponding to the round shape of the rear cover part 111-1.

In addition, comparing the configuration of the display device 500 shown in FIG. 1 and the configuration of the display device 500-1 shown in FIG. 6, the display device 500-1 shown in FIG. 6 further includes a stand 515 and a base 510 as elements. The base 510 is installed on a supporting surface, such as a desk or the ground. The stand 515 is coupled to the base 510 and the portion of the rear cover part 111-1 which is exposed to outside so that the display panel is positioned at a height from the base 510.

According to the above-described configuration of the set cover 110-1, by using the structure characteristic of the set cover 110-1, which is exposed to outside to cover the elements of the display device 500-1 and simultaneously makes the elements into a set, and the material characteristic of the set cover 110-1, which is formed of plastic and has excellent processability, multiple devices can be applied to the set cover 110-1.

Figure 7:
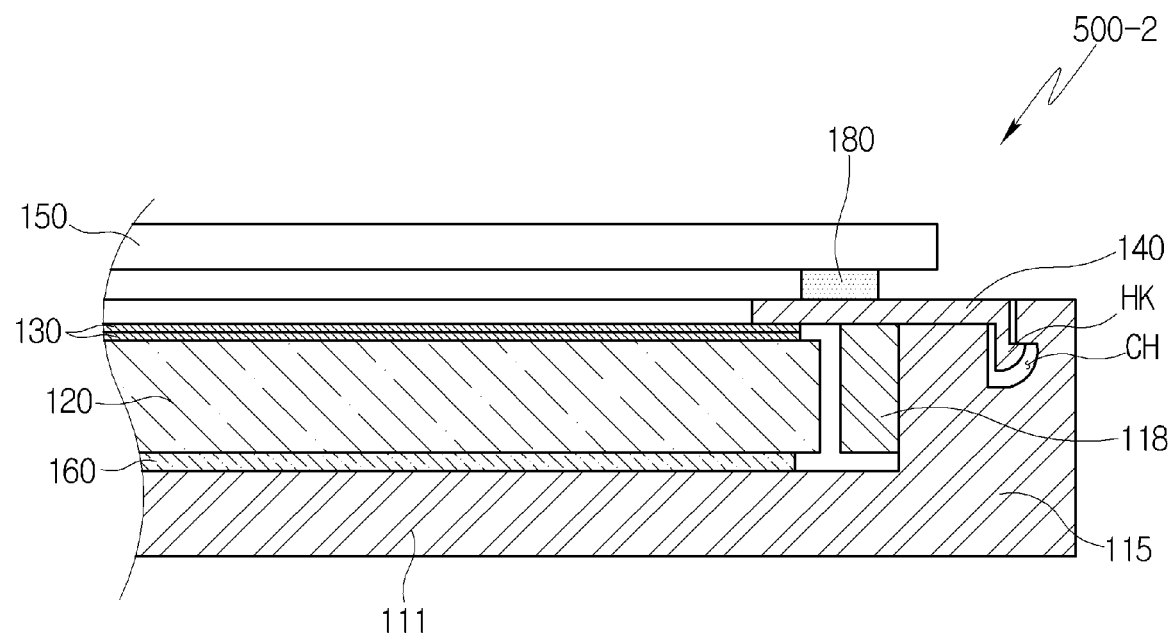
FIG. 7 is a cross-sectional view of a display device according to another embodiment of the present disclosure.
Figure 8:
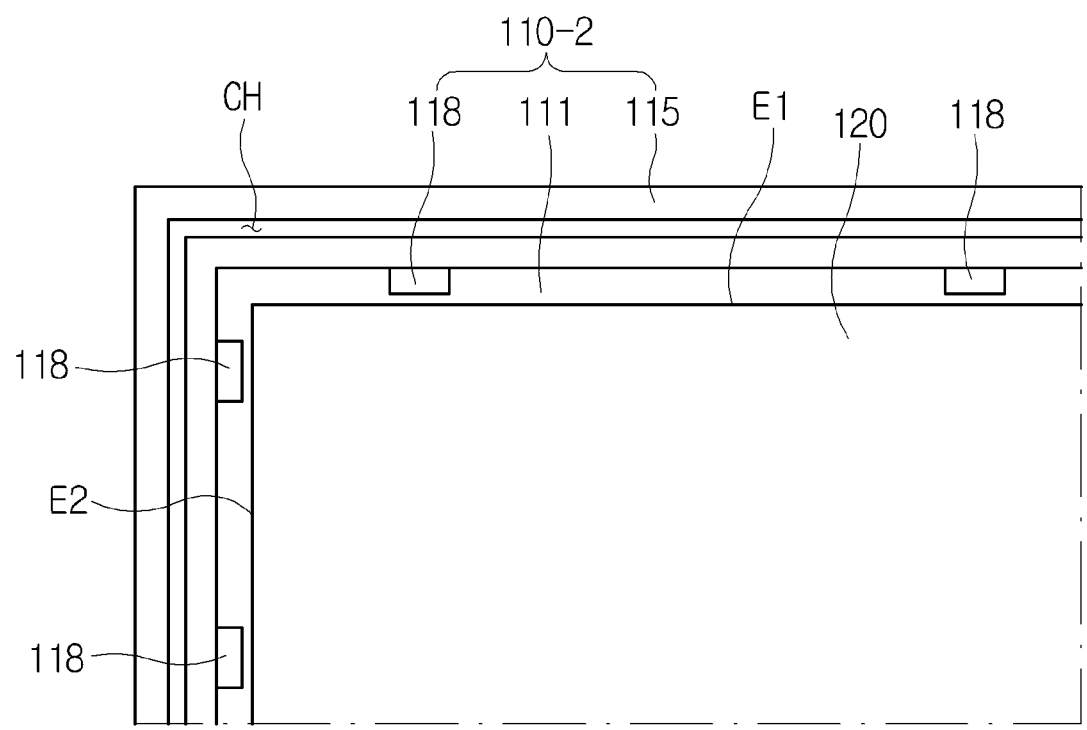
FIG. 8 is a partial plan view showing a coupling relationship between a set cover and a light guide plate in the display device shown in FIG. 7.

FIG. 7 is a cross-sectional view of a display device according to another embodiment of the present disclosure. FIG. 8 is a partial plan view showing a coupling relationship between a set cover and a light guide plate in the display device shown in FIG. 7.

For reference, FIG. 2 shows the cross section of the portion taken from the portion where the light source unit 125 of FIG. 2 is placed, in the display device 500 of FIG. 2, but FIG. 7 shows the cross section of the portion opposite to the portion where the light source unit is placed, in the display device 500-2. In addition, in order to clearly shown the coupling relationship between the set cover 110-2 and the light guide plate 120, among the elements of the display device 500-2, illustration of the elements other than the set cover 110-2 and the light guide plate 120 are omitted in FIG. 8.

In addition, in describing the embodiment shown in FIGS. 7 and 8, the elements already described in the embodiment with reference to FIGS. 1 and 2 are denoted by the same reference numerals as described above, and duplicate descriptions of the elements will be omitted.

Referring to FIGS. 7 and 8, the set cover 110-2 of the display device 500-2 includes a rear cover part 111, a side cover part 115, and multiple ribs 118. In the set cover 110-2, the multiple ribs 118 are elements for preventing the light guide plate 120 from moving freely inside the set cover 110-2.

In this embodiment, each of the multiple ribs 118 has a shape protruding toward the light guide plate 120 from the inner surface of the side cover part 110-2. Each of the multiple ribs 118 can be coupled to the light guide plate 120 with a predetermined gap therebetween so that the light guide plate 120 is easily assembled inside the set cover 110-2.

In this embodiment, in the case where the light guide plate 120 has a long side E1 and a short side E2, the multiple ribs 118 are arranged along the long side E1 and the short side E2 of the light guide plate 120, being spaced apart from each other. In addition, the multiple ribs 118 can have a shape formed integrally with the rear cover part 111 and the side cover part 115. Accordingly, the multiple ribs 118 can be composed of plastic.

In the meantime, unlike the embodiment of the present disclosure, when the rear cover part and the side cover part of the set cover are formed of a metal material, considering that the light guide plate is generally formed of a plastic material, the coefficient of thermal expansion of the light guide plate made of the plastic material is greater than the coefficient of thermal expansion of the set cover made of the metal material. Therefore, the light guide plate expanded by heat generates a force to push the set cover and this can cause the light guide plate to get loose. In order to solve or address the problem that the light guide plate can get loose, a light guide plate guide of a silicone material is inserted between the light guide plate and the set cover.

However, according to the above-described embodiment of the present disclosure, the rear cover part 111, the side cover part 115, and the multiple ribs 118 of the set cover 110 are integrally formed of a plastic material, and the light guide plate 120 is formed of a plastic material, so that the coefficient of thermal expansion of the set cover 110 can be substantially the same as the coefficient of thermal expansion of the light guide plate 120. Accordingly, in the embodiment of the present disclosure, it is possible to prevent the light guide plate from getting loose without using the light guide plate guide.

Although the present disclosure has been described with reference to the exemplary embodiments, those skilled in the art will appreciate that various modifications and variations can be made in the present disclosure without departing from the spirit or scope of the disclosure described in the appended claims.

As described above, according to the various embodiments of the present disclosure, the set cover can cover the elements of the display device and simultaneously, can make the elements of the display device into a set. Accordingly, an element covering the elements of the display device and an element making the elements of the display device into a set can be integrated as the set cover, so that the number of components constituting the display device can be reduced and the volume of the display device can thus be reduced. In addition, the structure of the display device is simple so that the assembly process of the display device can be simple and the time required to assemble the display device can be reduced.

According to the various embodiments of the present disclosure, the set cover of the display device is formed of a plastic material that is easy to mold, compared to a metal material. Accordingly, various designs for implementing a wall mount, a stand device, and a round design can be easily applied to the set cover.

According to the various embodiments of the present disclosure, viewed from the rear and the side of the display device, the exterior of the display device is implemented using a single component of the set cover. Therefore, viewed from both the rear and the side of the display device, gaps between multiple components are not present. Accordingly, completeness of the display device and excellence in the external appearance thereof can be enhanced.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a display panel;
a backlight assembly configured to provide light toward the display panel;
a set cover including a rear cover part and a side cover part, wherein the rear cover part covers a rear surface of the backlight assembly, and the side cover part extending from the rear cover part covers a side surface of the backlight assembly; and
a guide panel coupled to the set cover and supporting edges of the display panel,
wherein the set cover is composed of plastic, and the rear cover part and the side cover part have an integrally formed shape and are exposed to outside,
wherein the backlight assembly comprises:
a light source unit configured to generate light;
a light guide olate configured to guide the light provided from the light source unit toward the display panel; and
a reflective member positioned between the light guide plate and the rear cover part, and configured to reflect light,
wherein the set cover further includes:
an auxiliary receiving space provided with the rear cover part, and having a shape opened toward a rear of the rear cover part; and
a lid part configured to cover the auxiliary receiving space,
wherein the display device further comprises:
a light source housing formed of a metal material and coupled to the light source unit, and
wherein the light source housing includes:
a light source cover part partially surrounding the light source unit; and
a contact part extending from the light source cover part toward the auxiliary receiving space.

2. The display device of claim 1, wherein multiple wall-mount coupling holes are defined on a rear surface of the rear cover part which is exposed to outside.

3. The display device of claim 1, wherein at least a portion of a surface of the set cover which is exposed to outside has a round shape.

4. The display device of claim 1, further comprising:
a base installed on a supporting surface; and
a stand coupled to the base and a portion of the set cover which is exposed to outside, the stand positioning the display panel at a height from the base.

5. The display device of claim 1, wherein the set cover further includes one or more ribs each having a shape protruding toward the light guide plate from an inner surface of the side cover part, and
viewing the light guide plate on a plane, the ribs are multiple in number, and the multiple ribs are arranged along edges of the light guide plate, being spaced apart from each other.

6. The display device of claim 5, wherein the ribs have a shape integrally formed with the side cover part and the rear cover part, and the ribs are composed of a plastic material.

7. The display device of claim 1, further comprising:
a circuit film electrically connected to the display panel; and
a circuit board electrically connected to the circuit film, and configured to generate a control signal for driving the display panel,
wherein the circuit board is received inside the auxiliary receiving space and is in contact with the contact part of the light source housing.

8. The display device of claim 7, wherein viewing the circuit board and the contact part in a cross section, the circuit board and the contact part are horizontally arranged and are in contact with each other inside the auxiliary receiving space.

9. The display device of claim 1, wherein a top of the side cover part is provided with a coupling groove receiving the guide panel, and the guide panel received in the coupling groove and the side cover part are coupled in a hooking configuration.

10. The display device of claim 1, further comprising:
a front cover coupled to the set cover, and configured to cover an edge of the display panel,
wherein the front cover is composed of plastic and the front cover is exposed to outside.

11. The display device of claim 1,
wherein both of the set cover and the light guide plate are composed of plastic material, so that a coefficient of thermal expansion of the set cover is the same as a coefficient of thermal expansion of the light guide plate.

* * * * *